US012456606B2

(12) United States Patent
Son et al.

(10) Patent No.: US 12,456,606 B2
(45) Date of Patent: Oct. 28, 2025

(54) SUPPORT UNIT AND APPARATUS FOR TREATING SUBSTRATE

(71) Applicant: SEMES CO., LTD., Chungcheongnam-do (KR)

(72) Inventors: Hyoungkyu Son, Seoul (KR); Jong-Hwan An, Gyeonggi-do (KR); Jae Hyun Cho, Gyeonggi-do (KR); Min Keun Bae, Chungcheongnam-do (KR); Ogsen Galstyan, Chungcheongnam-do (KR); Dong Suk Kim, Gyeonggi-do (KR); Hyeon Gyu Kim, Chungcheongnam-do (KR); Won Seok Lee, Seoul (KR); Sung Je Kim, Gyeonggi-dO (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 773 days.

(21) Appl. No.: 17/545,130

(22) Filed: Dec. 8, 2021

(65) Prior Publication Data

US 2022/0199368 A1 Jun. 23, 2022

(30) Foreign Application Priority Data

Dec. 18, 2020 (KR) ........................ 10-2020-0178366

(51) Int. Cl.
*H01J 37/32* (2006.01)

(52) U.S. Cl.
CPC ... *H01J 37/32211* (2013.01); *H01J 37/32532* (2013.01); *H01J 37/32715* (2013.01); *H01J 37/32633* (2013.01)

(58) Field of Classification Search
CPC ............ C23C 16/4585; H01J 37/32091; H01J 37/32211; H01J 37/32449;
(Continued)

(56) References Cited

U.S. PATENT DOCUMENTS 6,074,518 A * 6/2000 Imafuku ........... H01J 37/32623
156/345.46
6,709,547 B1 * 3/2004 Ni ..................... H01L 21/67069
156/915

(Continued)

FOREIGN PATENT DOCUMENTS

CN 1591793 A 3/2005
CN 101242704 A 8/2008

(Continued)

OTHER PUBLICATIONS

Japanese Office Action issued in corresponding JP Patent Application No. 2021-199463, dated Dec. 27, 2022, with English Translation.

(Continued)

*Primary Examiner* — Benjamin Kendall
(74) *Attorney, Agent, or Firm* — Carter, DeLuca & Farrell LLP

(57) ABSTRACT

Provided is a support unit included in an apparatus for treating a substrate using plasma and configured to support the substrate. The support unit may include a power supply rod connected to a high-frequency power supply; an electrode plate configured to receive power from the power supply rod; and a ground ring provided to surround the electrode plate when viewed from the top and including a ground ring to be grounded.

19 Claims, 8 Drawing Sheets

(58) Field of Classification Search
CPC ........... H01J 37/32532; H01J 37/32568; H01J 37/32633; H01J 37/32642; H01J 37/32715; H01J 37/32834; H01L 21/68735
See application file for complete search history.

(56) References Cited

U.S. PATENT DOCUMENTS

| | | | | |
|---|---|---|---|---|
| 6,872,281 | B1 * | 3/2005 | Chen | H01J 37/32871 156/345.43 |
| 2002/0100555 | A1 * | 8/2002 | Hao | H01J 37/32568 156/345.43 |
| 2005/0005859 | A1 * | 1/2005 | Koshiishi | H01J 37/32642 118/728 |
| 2007/0224817 | A1 * | 9/2007 | Honda | H01J 37/32082 700/121 |
| 2007/0234960 | A1 * | 10/2007 | Honda | H01J 37/32532 156/345.47 |
| 2012/0003836 | A1 * | 1/2012 | Kellogg | H01L 21/68785 118/723 R |
| 2012/0160418 | A1 * | 6/2012 | Hanaoka | H01J 37/32568 156/345.38 |
| 2018/0358211 | A1 * | 12/2018 | Mun | H01L 21/6831 |

FOREIGN PATENT DOCUMENTS

| | | | |
|---|---|---|---|
| JP | 2012-15514 | A | 1/2012 |
| JP | 2012-186224 | A | 9/2012 |
| JP | 2017-228526 | A | 12/2017 |
| KR | 10-0783062 | B1 | 11/2007 |
| KR | 10-1632664 | B1 | 6/2016 |

OTHER PUBLICATIONS

Chinese Office Action issued by the China National Intellectual Property Administration on Mar. 27, 2025 in corresponding CN Patent Application No. 202111529819.3, with English translation.

* cited by examiner

SUPPORT UNIT AND APPARATUS FOR TREATING SUBSTRATE

CROSS-REFERENCE TO RELATED APPLICATIONS

This application claims priority to and the benefit of the Korean Patent Application No. 10-2020-0178366 filed in the Korean Intellectual Property Office on Dec. 18, 2020, the entire contents of which are incorporated herein by reference.

TECHNICAL FIELD

The present invention relates to a support unit and a substrate treating apparatus and more particularly, to a support unit included in an apparatus for treating a substrate using plasma and a substrate treating apparatus for treating a substrate using plasma.

BACKGROUND ART

Plasma is generated by a very high temperature, a strong electric field, or RF electromagnetic fields, and means an ionized gas condition consisting of ions, electrons, radicals and the like. A semiconductor device manufacturing process may include an etching process, an ashing process, and the like using the plasma. A process for treating a substrate such as a wafer or the like using the plasma is performed when ions and radical particles contained in the plasma collide with the wafer. It is important that the generated plasma is uniformly transmitted to the substrate, in order to properly perform the process of treating the substrate using the plasma. When the plasma is not uniformly transmitted to the substrate, uniformity of the substrate treatment is deteriorated.

SUMMARY OF THE INVENTION

An object of the present invention is to provide a support unit and a substrate treating apparatus capable of efficiently treating a substrate.

Further, an object of the present invention is to provide a support unit and a substrate treating apparatus capable of improving uniformity of the substrate treatment.

Further, an object of the present invention is to provide a support unit and a substrate treating apparatus for providing factors capable of controlling the flow of plasma generated in a chamber.

Further, an object of the present invention is to provide a support unit and a substrate treating apparatus capable of controlling plasma uniformity to be transmitted to a substrate.

Objects which can be obtained in the present invention are not limited to the aforementioned objects and other unmentioned objects will be clearly understood by those skilled in the art from the following description.

An exemplary embodiment of the present invention provides a support unit included in an apparatus for treating a substrate using plasma and configured to support the substrate. The support unit may include a power supply rod connected to a high-frequency power supply; an electrode plate configured to receive power from the power supply rod; and a ground ring provided to surround the electrode plate when viewed from the top and including a ground ring to be grounded.

According to the exemplary embodiment, the support unit may further include an elevating member configured to move the ground ring in a vertical direction.

According to the exemplary embodiment, the support unit may further include an insulating member disposed between the ground ring and the electrode plate when viewed from the top.

According to the exemplary embodiment, at an upper end of the ground ring, a ring member provided with a material different from the ground ring may be provided.

According to the exemplary embodiment, the ring member may be provided with a material containing quartz.

According to the exemplary embodiment, the upper surface of the ring member may be inclined upward in a direction toward the center of the substrate.

According to the exemplary embodiment, on the upper portion of the insulating member, a first ring; and a second ring provided to cover the first ring may be disposed when viewed from the top.

According to the exemplary embodiment, the second ring may be provided with the same material as the ring member.

According to the exemplary embodiment, the second ring and the ring member may be provided with a material containing quartz.

According to the exemplary embodiment, the ground ring may be provided with a material containing a metal.

An exemplary embodiment of the present invention provides an apparatus for treating a substrate. The substrate treating apparatus may include a chamber configured to have a treating space; a support unit configured to support the substrate in the treating space; and a gas supply unit configured to supply process gas excited in a plasma state to the treating space, wherein the support unit may include a power supply rod connected to a high-frequency power supply; an electrode plate configured to receive power from the power supply rod; and a ground ring provided to surround the electrode plate when viewed from the top and including a ground ring to be grounded.

According to the exemplary embodiment, the apparatus may further include a baffle disposed between the support unit and an inner wall of the chamber and formed with at least one or more through holes and moving holes to which the ground ring is inserted.

According to the exemplary embodiment, an insulating body may be disposed between the ground ring inserted to the moving hole and the baffle.

According to the exemplary embodiment, the support unit may further include an elevating member configured to move the ground ring in a vertical direction.

According to the exemplary embodiment, the apparatus may further include a controller, wherein the controller may control the elevating member so as to lift the ground ring to increase the treatment efficiency of the edge region of the substrate supported by the support unit.

According to the exemplary embodiment, the apparatus may further include a controller, wherein the controller may control the elevating member so as to lower the ground ring to increase the treatment efficiency of the central region of the substrate supported by the support unit.

An exemplary embodiment of the present invention provides an apparatus for treating a substrate. The apparatus may include a chamber having a treating space; a gas supply unit configured to supply process gas excited in a plasma state to the treating space; and a baffle disposed between the support unit and an inner wall of the chamber, wherein the support unit may include an electrode plate connected with a high-frequency power supply; a ground ring that is provided to surround the electrode plate, electrically connected with the baffle, and inserted to the moving hole formed in the baffle to be movable in a vertical direction; and an insulating member disposed between the ground ring and the electrode plate.

According to the exemplary embodiment, an insulating body may be disposed between the ground ring inserted to the moving hole and the baffle.

According to the exemplary embodiment, the support unit may further include an elevating member configured to change an area in which the ground ring is exposed to the treating space by moving the ground ring in a vertical direction.

According to the exemplary embodiment, the apparatus may further include a controller, wherein the controller may control the elevating member so as to lift the ground ring to increase the treatment efficiency of the edge region of the substrate supported by the support unit and to lower the ground ring to increase the treatment efficiency of the central region of the substrate supported by the support unit.

According to the exemplary embodiment of the present invention, it is possible to efficiently treat a substrate.

According to the exemplary embodiment of the present invention, it is possible to improve uniformity of substrate treatment.

According to the exemplary embodiment of the present invention, it is possible to provide factors capable of controlling the flow of plasma generated in a chamber.

According to the exemplary embodiment of the present invention, it is possible to control plasma uniformity to be transmitted to a substrate.

The effect of the present invention is not limited to the foregoing effects, and non-mentioned effects will be clearly understood by those skilled in the art from the present specification and the accompanying drawings.

DETAILED DESCRIPTION

Figure 1:
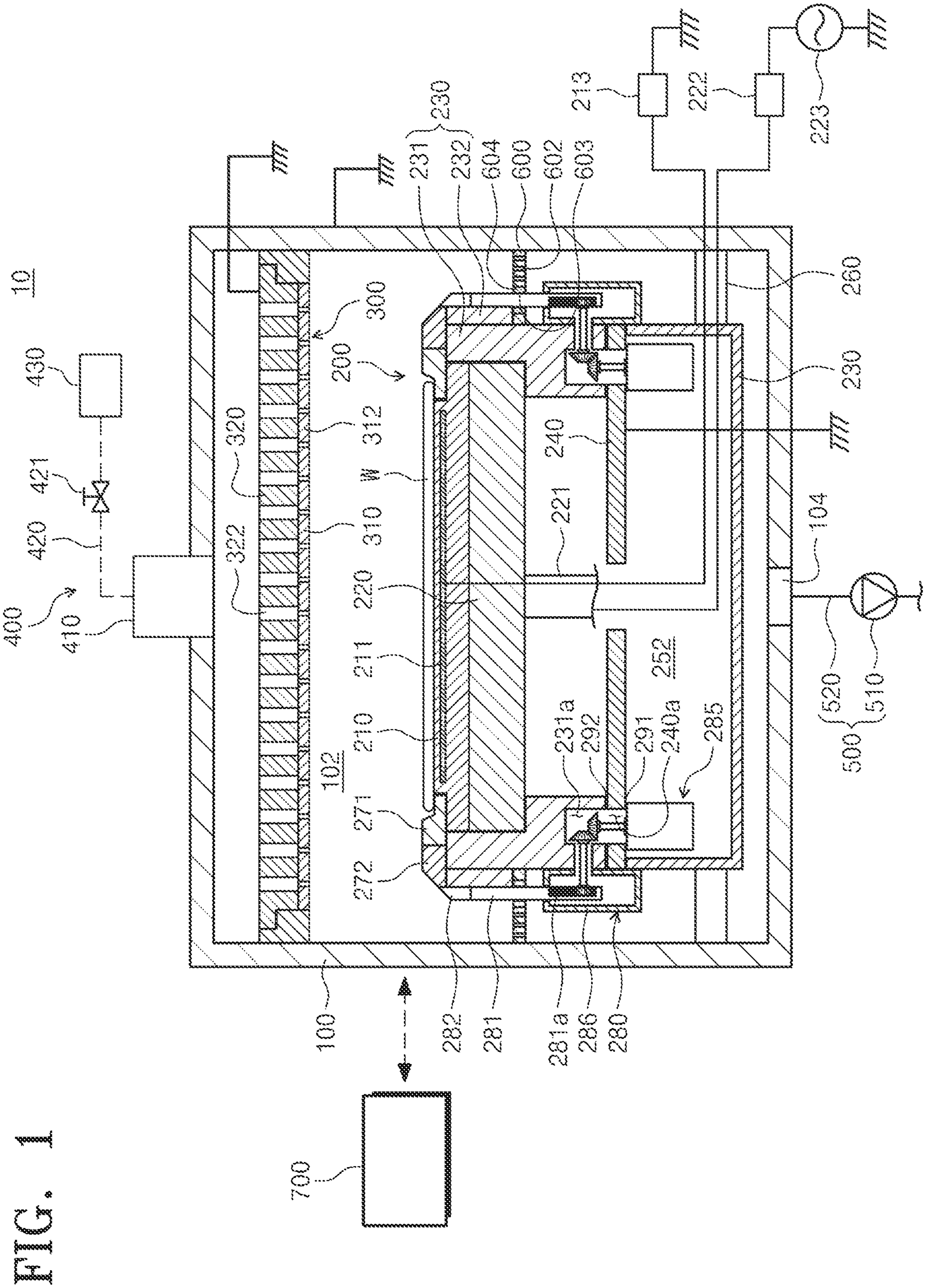
FIG. 1 is a diagram illustrating a substrate treating apparatus according to an exemplary embodiment of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the term of “including” any component will be understood to imply the inclusion of stated elements but not the exclusion of any other elements. In the present application, it should be understood that term “including” or “having” indicates that a feature, a number, a step, an operation, a component, a part or the combination thereof described in the specification is present, but does not exclude a possibility of presence or addition of one or more other features, numbers, steps, operations, components, parts or combinations thereof, in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only for distinguishing one component from the other component. For example, a first component may be named as a second component and similarly, the second component may also be named as the first component without departing from the scope of the present invention.

It should be understood that, when it is described that a component is “connected to” or “accesses” another component, the component may be directly connected to or access the other component or a third component may be present therebetween. In contrast, it should be understood that, when it is described that a component is “directly connected to” or “directly access” or “contact” another element, no component is present between the component and another component. Meanwhile, other expressions describing the relationship of the components, that is, expressions such as “between” and “directly between” or “adjacent to” and “directly adjacent to” should be similarly interpreted.

If it is not contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application.

Hereinafter, FIG. 1 is a diagram illustrating a substrate treating apparatus according to an exemplary embodiment of the present invention. Referring to FIG. 1, a substrate treating apparatus 10 treats a substrate W using plasma P. The substrate treating apparatus 10 may perform an etching process for removing a thin film, e.g., a silicon oxide film formed in the substrate W using the plasma P. Alternatively, the substrate treating apparatus 10 may perform an ashing process for removing a photosensitive film using the plasma P. However, it is not limited thereto, the substrate treating apparatus 10 may be used in various treating processes of treating the substrate W using the plasma P.

The substrate treating apparatus 10 may include a chamber 100, a support unit 200, a shower head unit 300, a gas supply unit 400, an exhaust unit 500, a baffle 600, and a controller 700.

The chamber 100 may have a treating space 102 in which a substrate treating process is performed therein. The chamber 100 may have a closed shape. The chamber 100 may be provided with a conductive material. For example, the chamber 100 may be provided with a material containing a metal. The chamber 100 may be grounded. A exhaust hole 104 connected to the exhaust unit 500 to be described below may be formed on a bottom surface of the chamber 100.

The chamber 100 may be provided with a heater (not illustrated). The heater may heat the chamber 100. The heater may be electrically connected to a heating power supply (not illustrated). The heater may generate heat by resisting a current applied to the heating power supply. The heat generated in the heater may be transmitted to a treating space 102. The treating space 102 may be maintained at a predetermined temperature by the heat generated in the heater. A plurality of heaters may be provided in the chamber 100. The heater may be provided in a coil-shaped hot wire. However, it is not limited thereto, and the heater may be variously modified to known devices capable of heating the chamber 100.

The support unit 200 may support the substrate W in the treating space 102. The support unit 200 may be provided with an electrostatic chuck for adsorbing and supporting the substrate W using an electrostatic force. The support unit 200 may include a dielectric plate 210, an electrode plate 220, an insulating member 230, a ground plate 240, a lower cover 250, an interface cover 260, a first ring 271, a second ring 272, and a plasma control assembly 280.

The substrate W is disposed on the dielectric plate 210. The dielectric plate 210 is provided in a disk shape. The upper surface of the dielectric plate 210 may have a stepped shape so that the height of a central region is higher than the height of an edge region. The dielectric plate 210 may be provided as a material containing a dielectric substance. An electrostatic electrode 211 may be provided with the dielectric plate 210. The electrostatic electrode 211 may be electrically connected to an adsorption power supply 213. The adsorption power supply 213 may be a DC power supply. A switch (not illustrated) may be provided between the electrostatic electrode 211 and the adsorption power supply 213. The electrostatic electrode 211 may be electrically connected to the adsorption power supply 213 by ON/OFF of the switch. When the switch is turned on, a DC current may be applied to the electrostatic electrode 211. The electrostatic force may be applied between the electrostatic electrode 211 and the substrate W by the current applied to the electrostatic electrode 211. The substrate W may be adsorbed and/or fixed to the dielectric plate 210 by an electrostatic force.

The electrode plate 220 may be provided below the dielectric plate 210. The upper surface of the electrode plate 220 may be in contact with the lower surface of the dielectric plate 210. The electrode plate 220 may be provided in a disk shape. The electrode plate 220 may be provided with a conductive material. As an example, the electrode plate 220 may be provided with a material containing aluminum. Further, in the electrode plate 220, a fluid passage (not illustrated) for controlling the electrode plate to a predetermined temperature may be formed. A cooling fluid may flow in the fluid passage. The electrode plate 220 may receive high-frequency power from a power supply rod 221 as described below. That is, thee electrode plate 220 may be a lower electrode.

The power supply rod 221 may apply power to the electrode plate 220. The power supply rod 221 may be electrically connected with the electrode plate 220. The power supply rod 221 may be connected with a lower power supply 223. The lower power supply 223 may be a high-frequency power supply for generating high-frequency power. The high-frequency power supply may be an RF power supply. The RF power supply may be a high bias power RF power supply. The power supply rod 221 may receive high-frequency power from the lower power supply 223, and transmit the received power to the electrode plate 220. The power supply rod 221 may be provided with a conductive material. For example, the power supply rod 221 may be provided with a material containing a metal. The power supply rod 221 may be a metal rod. Further, the power supply rod 221 may be connected to a matcher 222. The power supply rod 221 may be connected with the lower power supply 223 through the matcher 222. The matcher 225 may perform impedance matching.

The insulating member 230 may be disposed between the electrode plate 220 described above and a ground ring 281 to be described below. The insulating member 230 may include a first insulating member 231, and a second insulating member 230. The first insulating member 231 may be disposed on a ground plate 240 to be described below. The first insulating member 231 may have a ring shape when viewed from the top. Further, the upper surface of the first insulating member 231 may have a stepped shape in which the height of an outer upper surface is higher than the height of an inner upper surface. The above-described electrode plate 220 may be disposed on the inner upper surface of the first insulating member 231. Further, a first ring 271 to be described below may be disposed on the outer upper surface of the first insulating member 231.

In addition, the second insulating member 232 may have a ring shape when viewed from the top. The second insulating member 232 may have a larger diameter than the first insulating member 231 when viewed from the top. The second insulating member 232 may be disposed outside the first insulating member 231. The second insulating member 232 may be disposed further adjacent to the ground ring 281 than the first insulating member 231.

The ground plate 240 may be disposed below the first insulating member 231. The ground plate 240 may be grounded. The ground plate 240 may support the first insulating member 231. The ground plate 240 may have a disk shape when viewed from the top.

A lower cover 250 may be disposed below the ground plate 240. The lower cover 250 may have a cylindrical shape with an opened upper portion. The lower cover 250 may be combined with the ground plate 240 to form a lower space 252. In the lower space 252, various interface lines connected to the electrostatic electrode 211, the power supply rod 221, and the like may be passed. These interface lines may be connected to t substrates disposed outside the chamber 100 through the interface cover 260 connected to the lower cover 250.

The first ring 271 may have a ring shape when viewed from the top. The upper surface of the first ring 271 may have a stepped shape in which the height of an outer upper surface is higher than the height of an inner upper surface. The first ring 271 may be disposed through an edge region of the dielectric plate 210 and the outer upper surface of the first insulating member 231. The first ring 271 may be a focus ring.

The second ring 272 may have a ring shape when viewed from the top. The upper surface of the second ring 272 may have a shape with a flat inner upper surface and the outer upper surface thereof may have a shape downward inclined in a direction toward the outside of the substrate W supported to the support unit 200. The second ring 272 may be provided with a different material from the ground ring 281 to be described below. The second ring 272 may be provided with the same material as a ring member 282 to be described below. For example, the second ring 272 may be provided with a material containing quartz.

The plasma control assembly 280 may control the flow of the plasma P generated in the treating space 102. The plasma control assembly 280 may control uniformity of the plasma P transmitted to the substrate W. Specific contents of the plasma control assembly 280 will be described below.

The shower head unit 300 may disperse gas to be supplied from the upper portion. Further, the shower head unit 300 may allow the gas supplied by the gas supply unit 400 to be uniformly supplied to the treating space 102. The shower head unit 300 may include a shower head 310 and a gas spraying plate 320.

The shower head 310 is disposed below the gas spraying plate 320. The shower head 310 is located at a predetermined distance downward from the upper surface of the chamber 100. The shower head 310 is disposed on the support unit 200. A predetermined space is formed between the shower head 310 and the upper surface of the chamber 100. The shower head 310 may be provided in a plate shape with a constant thickness. The lower surface of the shower head 310 may be polarized to prevent arc occurrence by the plasma. The cross section of the shower head 310 may be provided to have the same shape and cross-sectional area as the support unit 200. A plurality of gas supply holes 312 are formed in the shower head 310. The gas supply holes 312 may be formed through the upper surface and the lower surface of the shower head 310 in a vertical direction.

The shower head 310 may be provided with a material that reacts with the plasma generated from the gas supplied by the gas supply unit 400 to generate a compound. For example, the shower head 310 may be provided with a material that reacts with an ion having the largest electro negativity among ions included in the plasma to generate a compound. For example, the shower head 310 may be provided with a material containing silicon (Si).

The gas spraying plate 320 may be disposed on the shower head 310. The gas spraying plate 320 may be located to be spaced apart from the upper surface of the chamber 100 at a predetermined distance. The gas spraying plate 320 may diffuse the gas supplied from the upper portion. Gas introduction holes 322 may be formed in the gas spraying plate 320. The gas introduction hole 322 may be formed at a position corresponding to the gas supply hole 312. The gas introduction hole 322 may communicate with the gas supply hole 312. The gas supplied from the upper portion of the shower head unit 300 may be supplied to the lower portion of the shower head 310 sequentially through the gas introduction hole 322 and the gas supply hole 312. The gas spraying plate 320 may include a metal material. The gas spraying plate 320 may be grounded. The gas spraying plate 320 may be grounded and may function as an upper electrode.

The insulating ring 380 is disposed to cover the circumference of the shower head 310 and the gas spraying plate. The insulating ring 380 may be provided in a circular ring shape as a whole. The insulating ring 380 may be provided with a non-metallic material.

The gas supply unit 400 may supply process gas into the treating space 102 of the chamber 100. The process gas supplied by the gas supply unit 400 may be excited in a plasma state. Further, the gas supplied by the gas supply unit 400 may be gas containing fluorine. For example, the process gas supplied by the gas supply unit 400 may include tetrafluoromethane.

The gas supply unit 400 may include a gas supply nozzle 410, a gas supply line 420, and a gas storage unit 430. The gas supply unit 410 may be provided at the center of the upper surface of the chamber 100. An injection port may be formed on the lower surface of the gas supply nozzle 410. The injection port may supply the process gas into the treating space 102 of the chamber 100. The gas supply line 420 may connect the gas supply nozzle 410 and the gas storage unit 430 to each other. The gas supply line 420 may supply the process gas stored in the gas storage unit 430 to the gas supply nozzle 410. The gas supply line 420 may be provided with a valve 421. The valve 421 opens and closes the gas supply line 420 and may adjust the flow rate of the process gas supplied through the gas supply line 420.

The exhaust unit 500 may exhaust the treating space 102. The exhaust unit 500 may exhaust a by-product that may be generated in the process of treating the substrate W in the treating space 102 or process gas supplied to the treating space 102 to the outside of the chamber 100. The exhaust unit 500 may include a decompression member 510, and a decompression line 520. The decompression member 510 may transmit decompression to the decompression line 520. The decompression line 520 may be connected to an exhaust hole 104 of the chamber 100. The decompression generated by the decompression member 510 is transmitted to the exhaust hole 104 through the decompression line 520 and the decompression transmitted to the exhaust hole 104 may be transmitted to the treating space 102. The decompression member 510 may be a pump. However, it is not limited thereto, and the decompression member 510 may be variously modified into known devices capable of transmitting the decompression to the treating space 102.

The baffle 600 may be disposed on the treating space 102. The baffle 600 may be disposed between the inner wall of the chamber 100 and the support unit 200. The baffle 600 may have a ring shape when viewed from the top. The baffle 600 may be grounded. For example, the baffle 600 is electrically connected with the grounded chamber 100 to be grounded through the chamber 100. However, it is not limited thereto, but the baffle 600 may be directly connected to the ground line, or may also be electrically connected to another grounded substrate other than the chamber 100.

In addition, the baffle 600 may have at least one or more through holes 602 through which the air flow generated by the decompression provided by the exhaust unit 500 flows. For example, a plurality of through holes 602 may be formed in the baffle 600, and the through holes 602 may be formed to penetrate the baffle 600 from the upper surface to the lower surface of the baffle 600.

In addition, the baffle 600 may be formed with a moving hole 603 to which the ground ring 281 to be described below is inserted. The moving hole 603 may be formed at a position further adjacent to the support unit 200 than the through hole 602. Further, the moving hole 603 may be inserted with the ground ring 281 to be formed in a size movable in a vertical direction. In addition, an insulating body 604 may be disposed between the ground ring 281 inserted into the moving hole 603 and the baffle 600. The insulating body 604 may be provided to surround the ground ring 281. The ground rings 281 and the baffle 600 may be charged by the plasma P or the like. Thus, a potential difference may be generated between the ground ring 281 and the baffle 600. For example, when the ground ring 281 is charged to 20 V and the baffle 600 is charged to 5 V, an electric field may be formed between the ground ring 281 and the baffle 600. In this case, an arching phenomenon may occur between the ground ring 281 and the baffle 600. The insulating body 604 is disposed between the ground ring 281 inserted into the moving hole 603 and the baffle 600 to minimize the occurrence of the arching phenomenon due to the above-mentioned potential difference.

The controller 700 may control the substrate treating apparatus 10. The controller 700 may control the substrate treating apparatus 10 so that the substrate treating apparatus 10 may treat the substrate W using the plasma P. For example, the controller 700 may control at least one or more of the support unit 200, the gas supply unit 400, and the exhaust unit 500 so that the substrate treating apparatus 10 may treat the substrate W using the plasma P. The controller 700 may include a processor controller consisting of a microprocessor (computer) executing a control of the substrate treating apparatus 10, a keyboard for performing a command input operation and the like to manage the substrate treating apparatus 10 by an operator, a user interface consisting of a display and the like for visualizing and displaying an moving situation of the substrate treating apparatus 10, and a storage unit stored with control programs or various data for executing the treatment executed in the substrate treating apparatus 10 by the control of the process controller and programs, that is, treatment recipes for executing the treatment in each configuration unit according to a treatment condition. In addition, the user interface and the storage unit may be connected to the process controller. The treatment recipe may be stored in a storage medium in the storage unit, and the storage medium may be a hard disk, and a transportable disk such as a CD-ROM, a DVD, and the like or a semiconductor memory such as a flash memory and the like.

Figure 2:
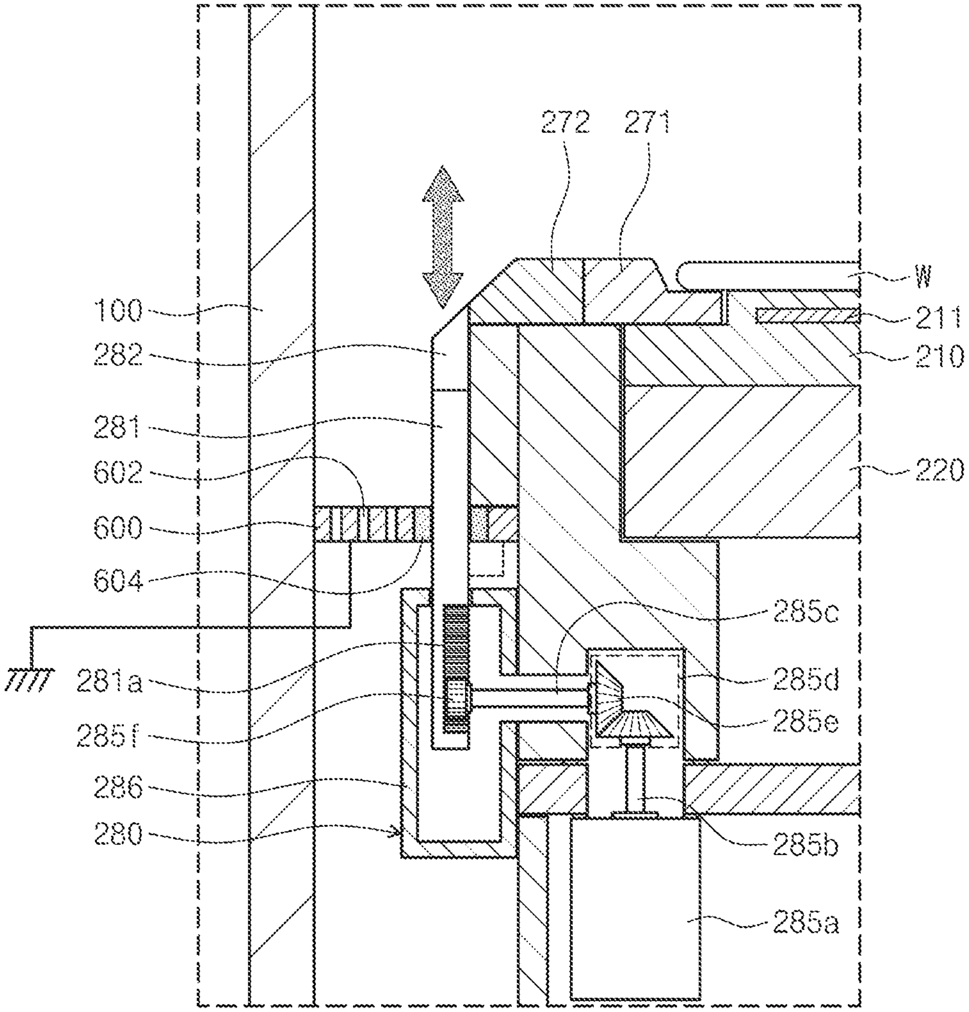
FIG. 2 is an enlarged diagram illustrating a part of a support unit of FIG. 1.

Hereinafter, the plasma control assembly 280 according to the exemplary embodiment of the present invention will be described in detail. FIG. 2 is an enlarged diagram illustrating a part of the support unit of FIG. 1. Referring to FIGS. 1 and 2, the plasma control assembly 280 may include a ground ring 281, a ring member 282, an elevating member 285, and a cover 286.

The ground ring 281 may be provided to cover the support unit 200 when viewed from the top. The ground ring 281 may be provided to cover the electrode plate 220 when viewed from the top. The ground ring 281 may be grounded. For example, the ground ring 281 may be grounded via the grounded baffle 600. However, it is not limited thereto, but the ground ring 281 may be electrically connected and grounded with another grounded configuration of the substrate treating apparatus 10. In addition, the ground ring 281 may also be directly connected and grounded to the ground line. In addition, the ground ring 281 may also be referred to as a ground member, a ground block, and the like. The ground ring 281 may be provided with a material containing a metal. For example, the ground ring 281 may be a metal ring. In addition, the ground ring 281 may be appropriately coated with a material containing ceramic so as to prevent the arching from occurring by the ground ring 291 moving in a vertical direction. For example, the surface of the ground ring 281 may be coated with a material containing ceramic. In addition, the vertical length of the ground ring 281 may be provided with a length enough to cover all side surfaces of the second insulating member 232.

At the upper end of the ground ring 281, a ring member 282 provided with a material different from the ground ring 281 may be provided. For example, the ring member 282 may be provided with the same material as the second ring 272. For example, the ring member 282 may be provided with a material containing quartz. Further, the upper surface of the ring member 282 may be inclined upward in a direction toward the center of the substrate. In other words, the upper surface of the ring member 282 may have a shape inclined downward in a direction toward the edge of the substrate W from the center of the substrate W. When the plasma P is generated in the treating space 102, the ground ring 281 is grounded, so that the plasma P of the central region of the substrate W may flow toward the ground ring 281 through the edge region of the substrate W. In this case, the ground ring 281 may be etched by the plasma P. The ring member 282 provided at the upper end of the ground ring 281 is provided with a material containing quartz and the upper surface thereof has a shape inclined downward in the direction toward the edge of the substrate W from the center of the substrate W, so that the ring member 282 may protect the ground ring 281 from being etched from the plasma P.

The elevating member 285 may move the ground ring 281 in a vertical direction. The elevating member 285 may change an area in which the ground ring 281 is exposed to the treating space 102. Hereinafter, an example of the elevating member 285 will be described. The elevating member 285 to be described below is only an example, and the elevating member 285 may be modified to various devices capable of moving the ground ring 281 in a vertical direction.

The elevating member 285 includes a motor **285*a*, a first rotation shaft 285*b*, a second rotation shaft 285*c*, a gear box 285*d*, a first gear 285*e*, and a second gear 285*f*. The motor 285*a* may rotate the first rotation shaft 285*b* in one direction. The rotational motion of the first rotation shaft 285*b* may be transmitted to the second rotation shaft 285*b* via the first gear 285*e*, which is a bevel gear provided in the gear box 285*d*. Further, the second gear 285*f*, which is a spur gear, may be provided to one end of the second rotation shaft 285*b*. The second gear 285*f* may engage with a sawtooth portion 281*a* formed on the ground ring 281 to move the ground ring 281 in a vertical direction. The second gear 285*f* and the sawtooth portion 281*a* may be a rack and pinion. In addition, at least one of the first gear 285*e* and the second gear 285*f* may be provided with a material containing a resin to minimize the arcing phenomenon from occurring. In addition, at least one of the first gear 285*e* and the second gear 285*f* may be provided with a material containing ceramic or engineering plastic other than a metal. For example, the first gear 285*e* and the second gear 285*f* may be provided with a material containing ceramic or engineering plastic other than a metal. In addition, the gear box 285*d*** may be provided with a material containing ceramic or engineering plastic other than a metal to minimize the arcing phenomenon from occurring.

Further, the first rotation shaft **285*b*, the second rotation shaft 285*c*, the first gear 285*e*, and the gear box 285*d* may be disposed in a first insulating member groove 231*a* formed on the first insulating member 231 and a ground plate groove 240*a* formed on the ground plate 240. Further, in order to minimize a problem in which the first insulating member groove 231*a* and the ground plate groove 240*a* are formed, resulting in arching, a second sealing member 292 may be provided between the first insulating member 231 and the ground plate 240, and a first sealing member 291 may be provided between the ground plate 240 and the motor 285***a*.

The cover 286 may prevent a portion where the second gear 285*f* and the sawtooth portion 281*a* engage with each other from being exposed to the treating space 102. The cover 286 may be an RF shield cover. The cover 286 may minimize process byproducts generated in the treating space 102 from being attached to the second gear 285*f* and the sawtooth portion 281*a*. The cover 286 may be provided as a material having plasma resistance to the plasma P. The cover 286 may be provided with a material having excellent corrosion resistance and heat resistance.

The controller 700 controls the elevating member 285 to control the flow of the plasma P generated on the substrate W. For example, the controller 700 may control the elevating member 285 so that the ground ring 281 controls the flow of the plasma P generated on the substrate W by adjusting the area exposed to the treating space 102.

Figure 3:
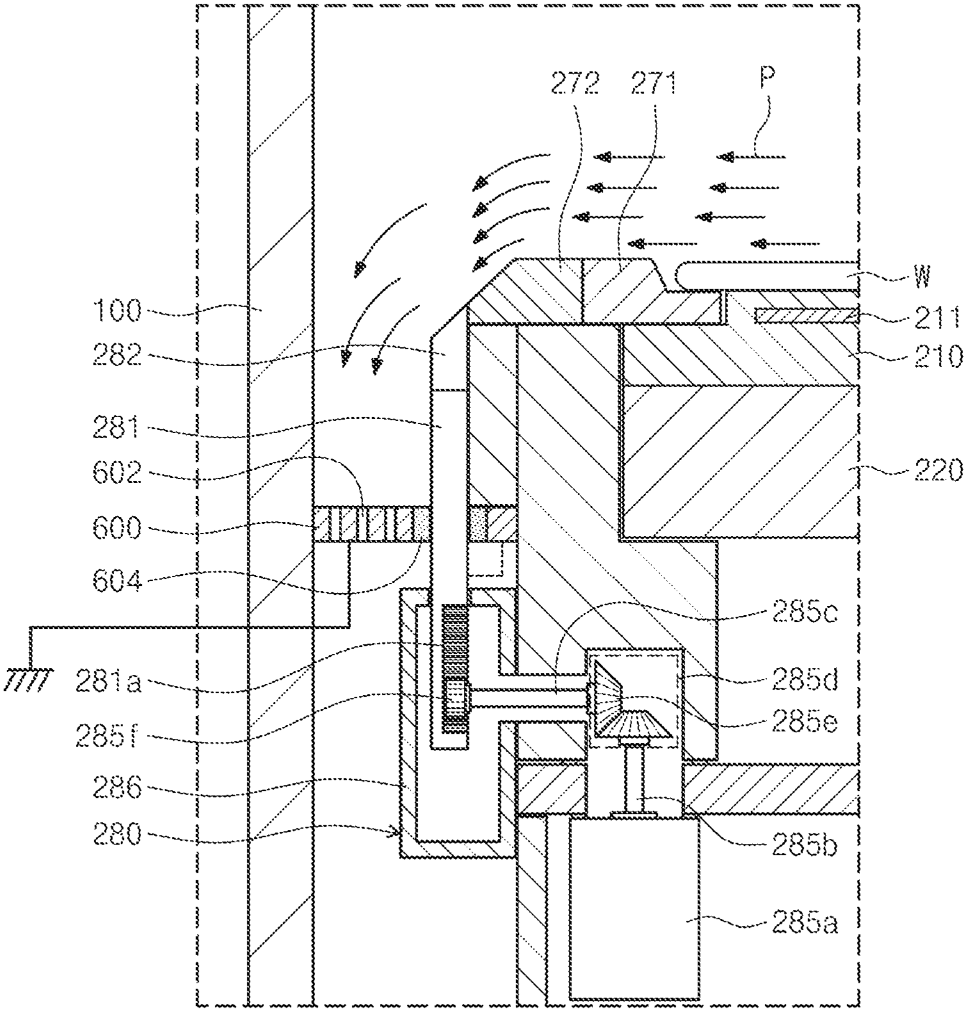
FIG. 3 is a diagram illustrating the plasma flow in a peripheral area of a substrate when a ground ring of FIG. 1 moves to be located at a first height.

For example, in the case of increasing the treatment efficiency for the edge region of the substrate W supported to the support unit 200, as illustrated in FIG. 3, the ground ring 281 may be located to a first height which is a relatively high height by lifting the ground ring 281. In this case, an area in which the ground ring 281 grounded is exposed to the treating space 102 may be increased. Thus, a relatively large amount of the plasma P generated in the central region of the substrate W may flow in a direction toward the grounded ground ring 281. That is, the plasmas P generated in the central region of the substrate W more flow in the direction toward the edge region of the substrate W, thereby further increasing the treatment efficiency to the edge region of the substrate W.

Figure 4:
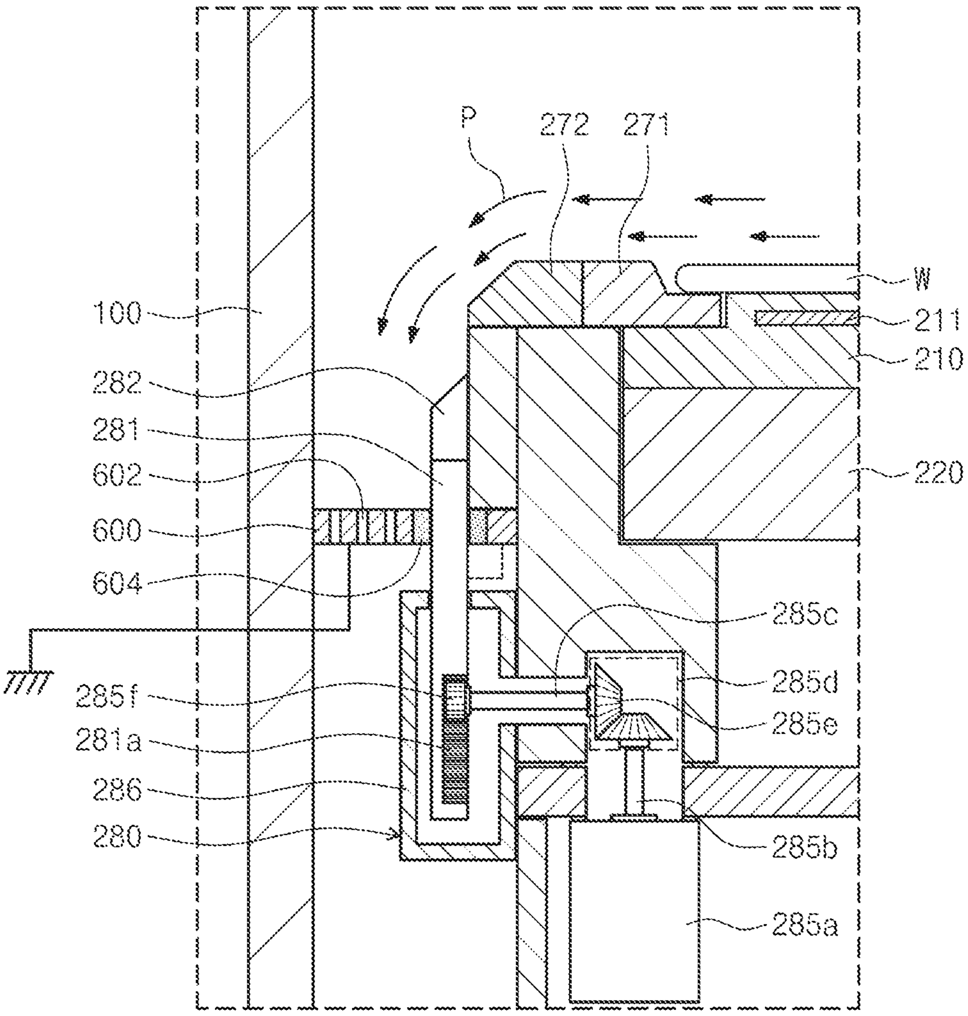
FIG. 4 is a diagram illustrating the plasma flow in a peripheral area of a substrate when a ground ring of FIG. 1 moves to be located at a second height.

Unlike this, in the case of increasing the treatment efficiency for the central region of the substrate W supported to the support unit 200, as illustrated in FIG. 4, the ground ring 281 may be located to a second height which is a relatively low height by lowering the ground ring 281. In this case, an area in which the ground ring 281 grounded is exposed to the treating space 102 may be decreased. Thus, a relatively small amount of the plasma P generated in the central region of the substrate W may flow in the direction toward the grounded ground ring 281. That is, the plasmas P generated in the central region of the substrate W flow relatively less in the direction toward the edge region of the substrate W, thereby further increasing the treatment efficiency to the central region of the substrate W.

That is, according to the exemplary embodiment of the present invention, the ground ring 281 moves in the vertical direction to adjust the area in which the ground ring 281 is exposed to the treating space 102, thereby adjusting the flow of the plasma P generated on the substrate W. That is, according to the exemplary embodiment of the present invention, an additional factor of controlling the flow of the plasma P is provided to adjust the treatment degree by the plasma P for each region of the substrate W, thereby further improving the uniformity of the plasma P transmitted to the substrate W.

Figure 5:
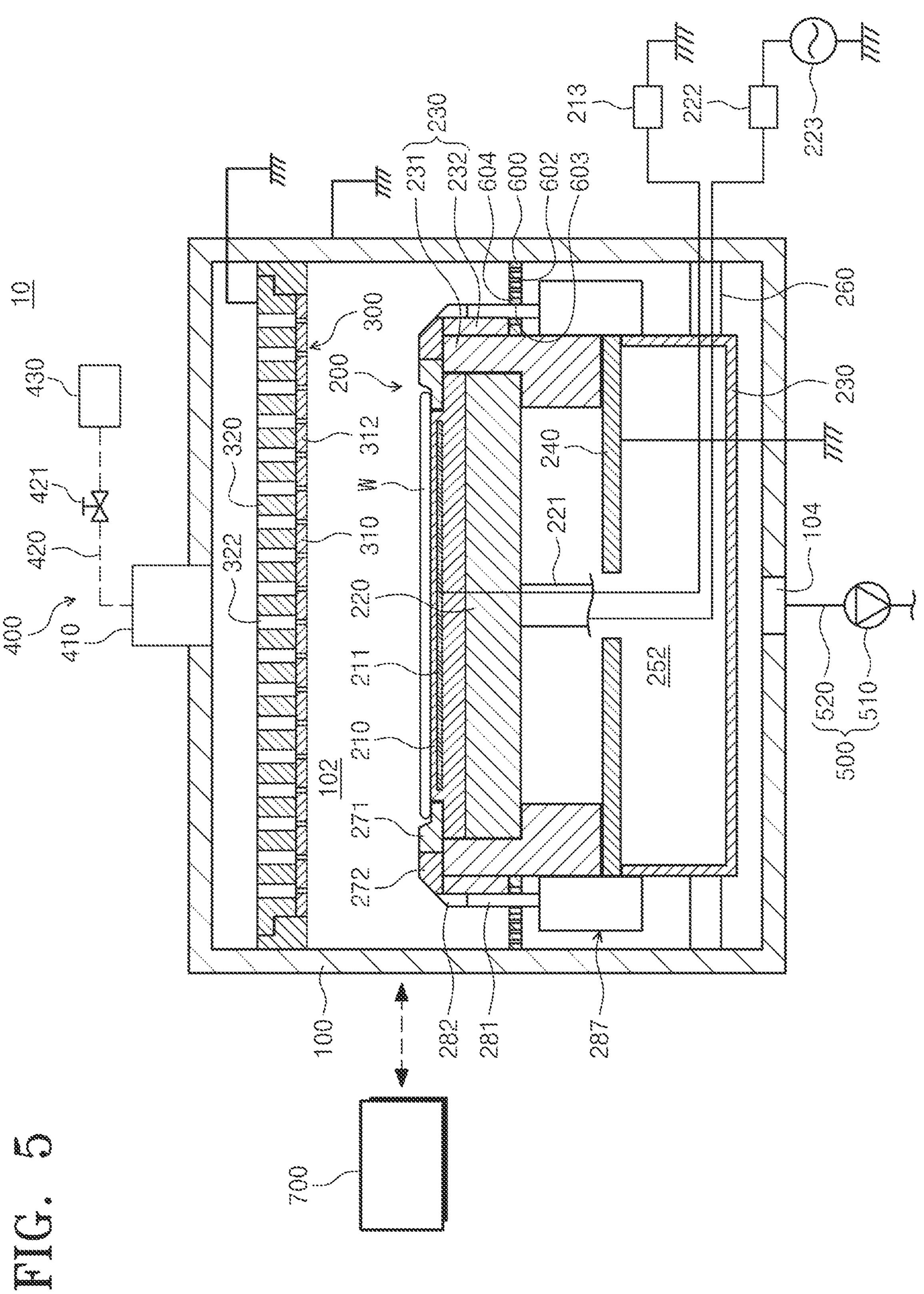
FIG. 5 is a diagram illustrating a substrate treating apparatus according to an exemplary embodiment of the present invention.
Figure 6:
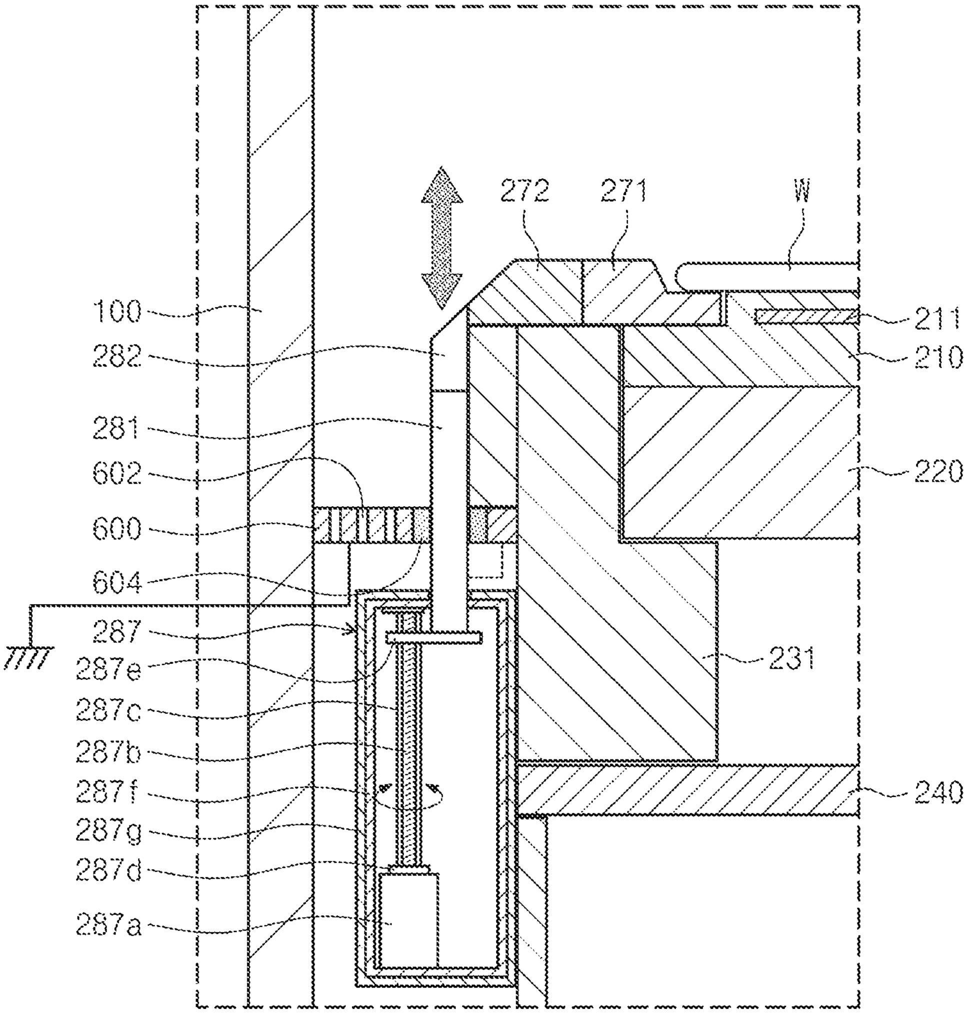
FIG. 6 is an enlarged diagram illustrating a part of a support unit of FIG. 5.

FIG. 5 is a diagram illustrating a substrate treating apparatus according to another embodiment of the present invention and FIG. 6 is an enlarged diagram illustrating a part of the support unit of FIG. 5. Since the substrate treating apparatus 10 according to another exemplary embodiment of the present invention is the same/similar as/to the substrate treating apparatus 10 according to the exemplary embodiment described above, hereinafter, an elevating member 287 will be mainly described.

Referring to FIGS. 5 and 6, the elevating member 287 according to the exemplary embodiment of the present invention may include a motor 287*a*, a ball screw 287*b*, a guide 287*c*, a support component 287*d*, a sliding component 287*e*, a housing 287*f*, and a shield cover 287*g*. The motor 287*a* may rotate the ball screw 287*b* in one direction. When the ball screw 287*b* rotates in one direction, the sliding component 287*e* may be moved in a vertical direction along the guide 287*c* and the ball screw 287*b*. The support component 287*d* may limit the movement range of the sliding component 278*e*. The sliding component 287*e* may be connected to the ground ring 281 described above. Further, the motor 287*a*, the ball screw 287*b*, the guide 287*c*, the surfaced component 287*d*, and the sliding component 287*e* may be disposed in an inner space of the housing 287*f*. Further, the housing 287*f* may be disposed below the baffle 600. The housing 287*f* may be disposed below the baffle 600 to be exposed to the treating space 102. The shield cover 287*g* may be provided to surround the housing 287*f*. The shield cover 287*g* may be provided with a material having excellent corrosion resistance and heat resistance. For example, the shield cover 287*g* may be provided with engineering plastic. The shield cover 287*g* may prevent the housing 287*f* from being exposed to the treating space 102. The shield cover 287*g* may be an RF shield cover. The shield cover 287*g* may minimize process byproducts that may be generated in the treating space 102 from being transmitted to the housing 287*f* or the substrate disposed in the inner space of the housing 287*f*.

Further, like the exemplary embodiment described above, the controller 700 may control the elevating member 287 to control the flow of the plasma P generated on the substrate W. For example, the controller 700 may control the elevating member 287 so that the ground ring 281 controls the flow of the plasma P generated on the substrate W by adjusting the area exposed to the treating space 102.

Figure 7:
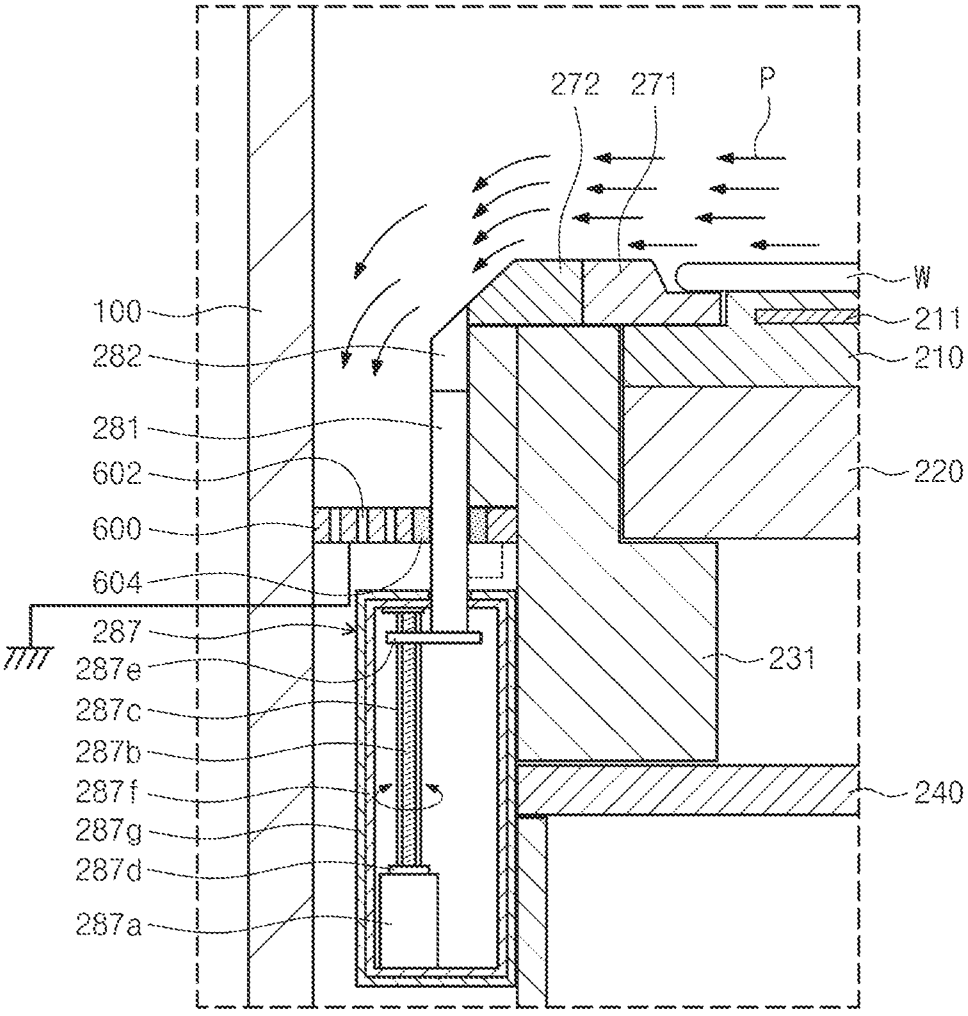
FIG. 7 is a diagram illustrating the plasma flow in a peripheral area of a substrate when a ground ring of FIG. 5 moves to be located at a first height.

For example, in the case of increasing the treating efficiency for the edge region of the substrate W supported to the support unit 200, as illustrated in FIG. 7, the ground ring 281 may be located to a first height which is a relatively high height by lifting the ground ring 281. In this case, an area in which the ground ring 281 grounded is exposed to the treating space 102 may be increased. Thus, a relatively large amount of the plasma P generated in the central region of the substrate W may flow in a direction toward the grounded ground ring 281. That is, the plasmas P generated in the central region of the substrate W more flow in the direction toward the edge region of the substrate W, thereby further increasing the treatment efficiency to the edge region of the substrate W.

Figure 8:
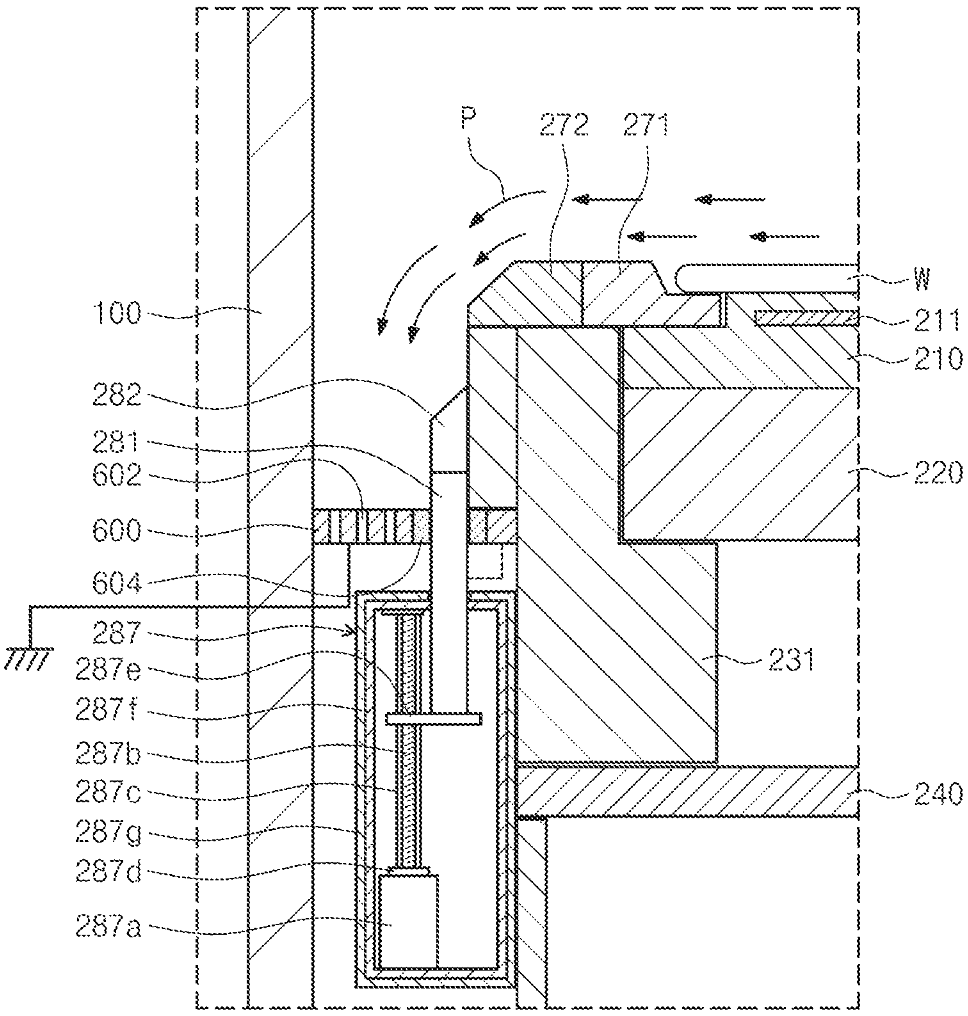
FIG. 8 is a diagram illustrating the plasma flow in a peripheral area of a substrate when a ground ring of FIG. 5 moves to be located at a second height.

Unlike this, in the case of increasing the treatment efficiency for the central region of the substrate W supported to the support unit 200, as illustrated in FIG. 8, the ground ring 281 may be located to a second height which is a relatively low height by lowering the ground ring 281. In this case, an area in which the ground ring 281 grounded is exposed to the treating space 102 may be decreased. Thus, a relatively small amount of the plasma P generated in the central region of the substrate W may flow in the direction toward the grounded ground ring 281. That is, the plasmas P generated in the central region of the substrate W flow relatively less in the direction toward the edge region of the substrate W, thereby further increasing the treatment efficiency to the central region of the substrate W.

In the aforementioned embodiment, it has been described as an example that the gas spraying plate 320 of the shower head unit 300 is grounded and the lower power supply 223 is connected to the electrode plate 220, but it is not limited thereto. For example, the high-frequency power supply is connected to the gas spraying plate 320, and the electrode plate 220 may also be grounded. Alternatively, the high-frequency power supply may also be connected to the gas spraying plate 320 and the electrode plate 220.

In addition, in the aforementioned embodiment, it has been described as an example that the substrate forming an electric field generating the plasma P is the electrode plate 220, it is not limited thereto, and for example, like an ICP type plasma generating apparatus, an antenna may form an electric field to generate the plasma P.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A support unit included in an apparatus for treating a substrate using plasma and configured to support the substrate, the support unit comprising:

a power supply rod connected to a high-frequency power supply;

an electrode plate configured to receive power from the power supply rod;

a ground ring provided to surround the electrode plate when viewed from the top and including a ground ring to be grounded;

an insulating member disposed between the ground ring and the electrode plate when viewed from the top;

an elevating member configured to move the ground ring in a vertical direction, wherein the elevating member comprises a first rotation shaft configured to transmit rotational motion to a second rotation shaft, and wherein the first rotation shaft is perpendicular to the second rotation shaft; and a ground plate, wherein the ground plate is grounded and is configured to support at least a portion of the insulating member.

2. The support unit of claim 1, wherein at an upper end of the ground ring, a ring member provided with a material different from the ground ring is provided.

3. The support unit of claim 2, wherein the ring member is provided with a material containing quartz.

4. The support unit of claim 2, wherein the upper surface of the ring member is inclined upward in a direction toward the center of the substrate.

5. The support unit of claim 4, wherein on the upper portion of the insulating member, a first ring; and a second ring provided to cover the first ring are disposed when viewed from the top.

6. The support unit of claim 5, wherein the second ring is provided with the same material as the ring member.

7. The support unit of claim 6, wherein the second ring and the ring member are provided with a material containing quartz.

8. The support unit of claim 1, wherein the ground ring is provided with a material containing a metal.

9. The support unit of claim 1, wherein the first rotation shaft is disposed in a first groove defined in the insulating member and a second groove defined in the ground plate.

10. The support unit of claim 9, further comprising a sealing member disposed between the insulating member and the ground plate.

11. The support unit of claim 1, further comprising a lower cover disposed below the ground plate, wherein the lower cover and the ground plate define a lower space configured to hold one or more interface lines for connecting to at least one of an electrode or a power supply.

12. A substrate treating apparatus of treating a substrate, comprising:

a chamber configured to have a treating space;

a support unit configured to support the substrate in the treating space; and a gas supply unit configured to supply process gas excited in a plasma state to the treating space, wherein the support unit includes a power supply rod connected to a high-frequency power supply;

an electrode plate configured to receive power from the power supply rod;

a ground ring provided to surround the electrode plate when viewed from the top and including a ground ring to be grounded;

an elevating member configured to move the ground ring in a vertical direction, wherein the elevating member comprises a first rotation shaft configured to transmit rotational motion to a second rotation shaft, and wherein the first rotation shaft is perpendicular to the second rotation shaft; and a cover configured to prevent at least a portion of the elevating member from being exposed to the treating space.

13. The substrate treating apparatus of claim 12, further comprising:

a baffle disposed between the support unit and an inner wall of the chamber and formed with at least one or more through holes and moving holes to which the ground ring is inserted.

14. The substrate treating apparatus of claim 13, wherein an insulating body is disposed between the ground ring inserted to the moving hole and the baffle.

15. The substrate treating apparatus of claim 12, further comprising:

a controller, wherein the controller controls the elevating member so as to lift the ground ring to increase the treatment efficiency of the edge region of the substrate supported by the support unit.

16. The substrate treating apparatus of claim 12, further comprising:

a controller, wherein the controller controls the elevating member so as to lower the ground ring to increase the treatment efficiency of the central region of the substrate supported by the support unit.

17. A substrate treating apparatus of treating a substrate comprising:

a chamber having a treating space;

a support unit configured to support the substrate in the treating space; and a gas supply unit configured to supply process gas excited in a plasma state to the treating space; and a baffle disposed between the support unit and an inner wall of the chamber, wherein the support unit includes an electrode plate connected with a high-frequency power supply;

a ground ring that is provided to surround the electrode plate, electrically connected with the baffle, and inserted to a moving hole formed in the baffle to be movable in a vertical direction;

an elevating member configured to change an area in which the ground ring is exposed to the treating space by moving the ground ring in a vertical direction, wherein the elevating member comprises a first rotation shaft configured to transmit rotational motion to a second rotation shaft, and wherein the first rotation shaft is perpendicular to the second rotation shaft;

a cover configured to prevent at least a portion of the elevating member from being exposed to the treating space; and an insulating member disposed between the ground ring and the electrode plate.

18. The substrate treating apparatus of claim 17, wherein an insulating body is disposed between the ground ring inserted to the moving hole and the baffle.

19. The substrate treating apparatus of claim 17, further comprising:

a controller, wherein the controller controls the elevating member so as to lift the ground ring to increase the treatment efficiency of the edge region of the substrate supported by the support unit, and to lower the ground ring to increase the treatment efficiency of the central region of the substrate supported by the support unit.

* * * * *